(12) United States Patent
Chan et al.

(10) Patent No.: US 9,837,351 B1
(45) Date of Patent: Dec. 5, 2017

(54) AVOIDING GATE METAL VIA SHORTING TO SOURCE OR DRAIN CONTACTS

(71) Applicant: International Business Machines Corporation, Armonk, NY (US)

(72) Inventors: Victor W. C. Chan, Guilderland, NY (US); Xuefeng Liu, Schenectady, NY (US); Yann A. M. Mignot, Slingerlands, NY (US); Yongan Xu, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/175,555

(22) Filed: Jun. 7, 2016

(51) Int. Cl.
| H01L 21/768 | (2006.01) |
| H01L 23/522 | (2006.01) |
| H01L 23/528 | (2006.01) |
| H01L 21/311 | (2006.01) |
| H01L 21/28  | (2006.01) |

(52) U.S. Cl.
CPC .... H01L 23/5226 (2013.01); H01L 21/28247 (2013.01); H01L 21/31144 (2013.01); H01L 21/76816 (2013.01); H01L 21/76834 (2013.01); H01L 21/76877 (2013.01); H01L 23/528 (2013.01); H01L 23/5283 (2013.01)

(58) Field of Classification Search
CPC ......... H01L 21/76816; H01L 21/76819; H01L 21/76834; H01L 21/76837; H01L 21/76877; H01L 21/76897; H01L 23/5226; H01L 23/5283; H01L 29/41775; H01L 29/42376; H01L 29/66515
See application file for complete search history.

(56) References Cited

U.S. PATENT DOCUMENTS

| 6,369,423 | B2 | 4/2002 | Ohiwa et al. |
| 6,960,523 | B2 | 11/2005 | Maldei et al. |
| 8,436,404 | B2 | 5/2013 | Bohr et al. |
| 8,524,592 | B1 | 9/2013 | Xie et al. |
| 8,871,582 | B2 | 10/2014 | Pham et al. |
| 8,906,754 | B2 | 12/2014 | Pham et al. |
| 9,054,178 | B2 | 6/2015 | Bohr et al. |
| 9,224,866 | B2 | 12/2015 | Basu et al. |
| 9,263,537 | B2 | 2/2016 | Pham et al. |
| 9,379,058 | B2 * | 6/2016 | Song ..................... H01L 23/485 |
| 9,397,049 | B1 * | 7/2016 | Fan ................... H01L 21/76897 |
| 9,508,825 | B1 * | 11/2016 | Basker ................. H01L 29/665 |
| 2016/0056263 | A1 | 2/2016 | Grasshoff et al. |

(Continued)

*Primary Examiner* — Stephen W Smoot
(74) *Attorney, Agent, or Firm* — Cantor Colburn LLP; Vazken Alexanian

(57) ABSTRACT

Techniques relate to forming a gate metal via. A gate contact has a bottom part in a first layer. A cap layer is formed on the gate contact and first layer. The gate contact is formed on top of the gate. A second layer is formed on the cap layer. The second layer and cap layer are recessed to remove a portion of the cap layer from a top part and upper sidewall parts of the gate contact. A third layer is formed on the second layer, cap layer, and gate contact. The third layer is etched through to form a gate trench over the gate contact to be around the upper sidewall parts of the gate contact. The gate trench is an opening that stops on the cap layer. Gate metal via is formed on top of the gate contact and around upper sidewall parts of the gate contact.

16 Claims, 20 Drawing Sheets

(56) References Cited

U.S. PATENT DOCUMENTS

2016/0099329 A1    4/2016  Basu et al.
2016/0133623 A1*   5/2016  Xie ...................... H01L 27/088
                                                          257/384
2017/0125530 A1*   5/2017  Zhang ............... H01L 29/41791

* cited by examiner

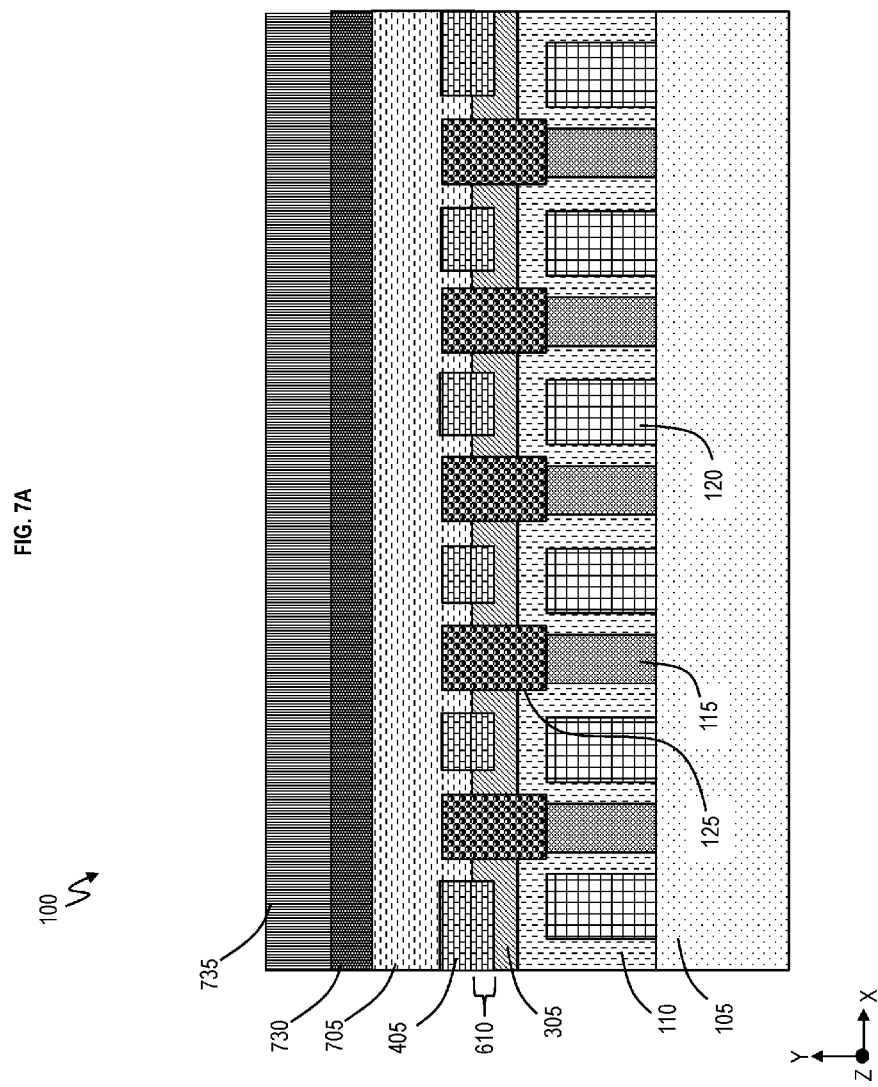

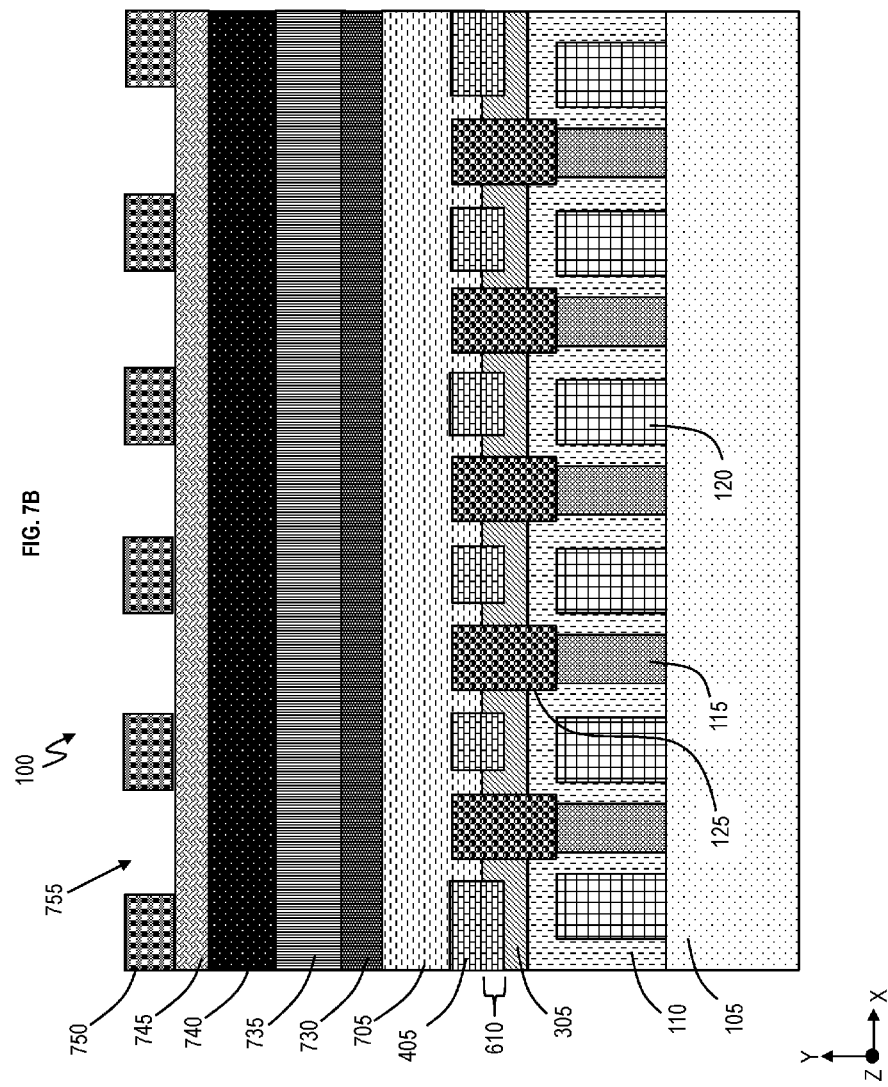

US 9,837,351 B1

AVOIDING GATE METAL VIA SHORTING TO SOURCE OR DRAIN CONTACTS

BACKGROUND

The present invention relates generally to integrated circuits, and more specifically, to avoiding gate metal via shorting to source or drain contacts.

Back-end-of-line (BEOL) is a phrase used to refer to the second portion of integrated circuit fabrication where the individual devices (transistors, capacitors, resistors, etc.) are interconnected with wire interconnects (i.e., the metallization layer) on the wafer. Common metals used to form the wire interconnects are copper and aluminum. BEOL generally begins when the first layer of metal is deposited on the wafer. BEOL includes the formation of contacts, insulating layers (dielectrics), metal levels, and bonding sites for chip-to-package connections.

SUMMARY

According to one or more embodiments, a method of forming a gate metal via is provided. The method includes forming a gate contact to have a bottom part in a first layer, and forming a cap layer on the gate contact and the first layer, where the first layer includes a source contact, a drain contact, a gate, and the bottom part of the gate contact. The gate contact is formed on top of the gate. Also, the method includes forming a second layer on the cap layer, and recessing the second layer and the cap layer, such that a portion of the cap layer is removed from a top part and upper sidewall parts of the gate contact. The method includes forming a third layer on top of the second layer, the cap layer, and the gate contact, and etching through the third layer to form a gate trench over the gate contact such that the gate trench is around the upper sidewall parts of the gate contact, where the gate trench is an opening that stops on the cap layer. Further the method includes forming the gate metal via in the gate trench such that the gate metal via is on top of the gate contact and around the upper sidewall parts of the gate contact.

According to one or more embodiments, a method of forming a gate metal via is provided. The method includes forming a gate contact to have a bottom part in a first layer, and forming a cap layer on the gate contact and the first layer. The first layer includes a source contact, a drain contact, a gate, and the bottom part of the gate contact. The gate contact is formed on top of the gate. The method includes laterally removing the cap layer from upper sidewall parts of the gate contact, forming a second layer on the cap layer and the upper sidewall parts of the gate contact, and recessing the second layer and the cap layer to expose a top part of the gate contact. Also, the method includes forming a third layer on top of the second layer and the gate contact, and etching through the third layer and portions of the second layer abutting the gate contact, where the etching forms a gate trench over the gate contact such that the gate trench is an opening around upper sidewall parts of the gate contact. The gate trench stops on the cap layer. Further, the method includes forming the gate metal via in the gate trench such that the gate metal via is on top of the gate contact and around the upper sidewall parts of the gate contact.

According to one or more embodiments, a semiconductor device having a gate metal via is provided. The semiconductor device includes a gate contact having a bottom part in a first layer, a cap layer formed on the first layer so as to abut sides of the gate contact, and a second layer formed on the cap layer and a third layer formed on top of the second layer. Also, the semiconductor device includes the gate metal via formed on top of the gate contact and around upper sidewall parts of the gate contact, where the gate metal via is formed through the second and third layers to stop on the cap layer.

BRIEF DESCRIPTION OF THE DRAWINGS

FIG. 7A is a cross-sectional view of the structure depicting deposition of layers to be utilized in preparation for metal line formation according to one or more embodiments.

FIG. 7B is a cross-sectional view of the structure depicting deposition of layers in preparation for patterning a gate metal via trench according to one or more embodiments.

DETAILED DESCRIPTION

Figure 1:
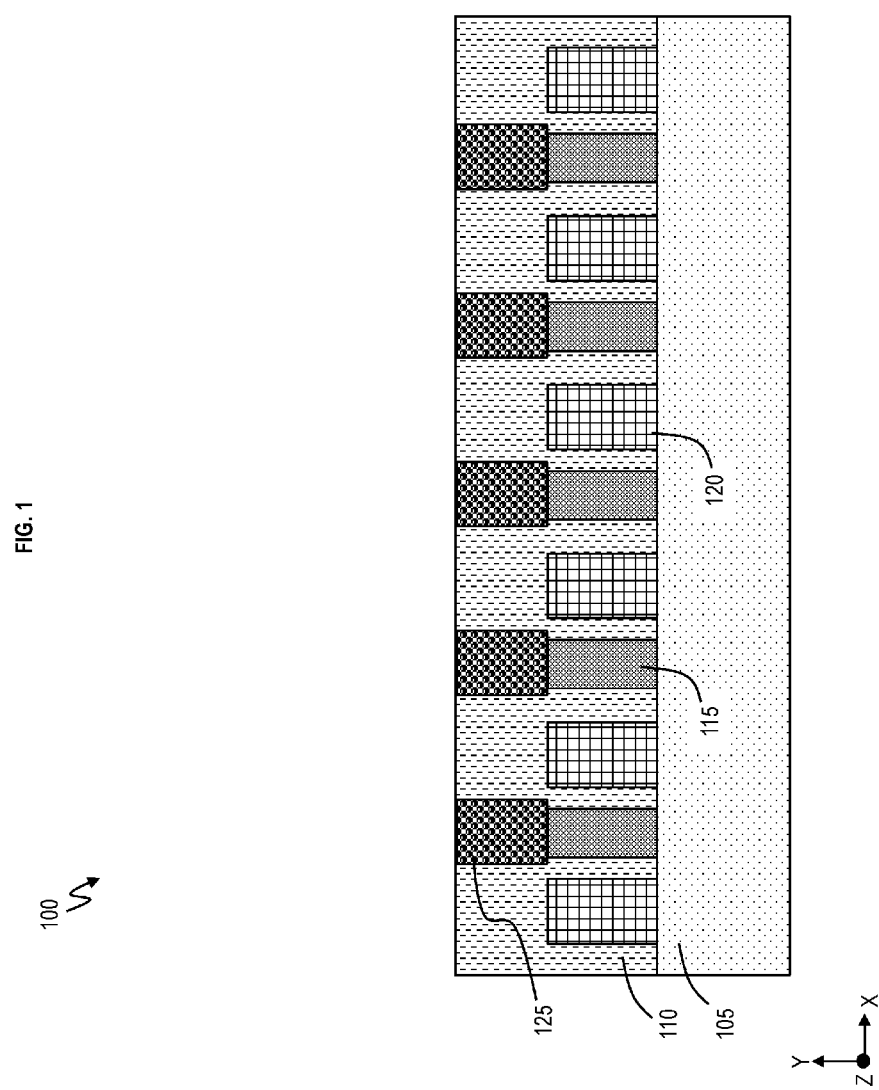
FIG. 1 is a cross-sectional view of a semiconductor structure according to one or more embodiments.

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term scaling is used herein to describe reducing the footprint of a semiconductor device without compromising device performance. Aggressive scaling continues to occur for 10 nanometer (nm) processing technology, 7 nm processing technology, and below. Because of the continuously smaller device dimensions that result from scaling, shorting may occur between gate metal vias and contacts for the source or drain when patterning gate contacts and gate metal via contacts on dense gates. For example, with 14 nm technology, the state-of-the-art may utilize a wrap-around gate metal via (V0) to connect to the gate contact (CB), but this approach can cause a short to the source and/or drain contacts (CA). Gate contacts are sometimes referred to as CB or metal layer M0. The gate metal via may be referred to as V0. Gate metal via V0 is the interconnection utilized to contact the gate contact (CB).

According to one or more embodiments, novel methodologies and structures are disclosed in which a cap layer is provided as an etch stop layer when forming the gate trench/via for the gate metal via (V0). The cap layer is configured to prevent the gate metal via (V0) short to the source and/or drain contacts (CA).

With the introduction of the cap layer, embodiments allow for the continued use of a normal interlayer dielectric (ILD) layer thickness or even a smaller thickness to maintain the specifications utilized for larger technology processing, for example, utilized for greater than 14 nm, 20 nm, or so forth. A thinner ILD gives less resistance because a shorter gate metal via V0 can be utilized. Additionally, the cap layer allows V0 over-etch and less reactive ion etching (RIE) lag issues because the cap layer protects the source and drain contacts (CA). Because the source and/or drain contacts (CA) are protected by the cap layer during the etching of the gate metal via V0, a larger gate metal via V0 can be utilized (as compared to the state-of-the-art), which provides a larger process window.

FIG. 1 is a cross-sectional view of a semiconductor structure 100 according to one or more embodiments. The semiconductor structure 100 may be an integrated circuit having many layers formed with proper doping for p-type and/or n-type transistors.

The structure 100 includes a substrate 105. The substrate 105 may be a fin in a finFET device. Example semiconductor materials of the substrate 105 may include silicon, silicon germanium, germanium, etc. The substrate 105 may be doped as desired at various locations to form p-type wells and n-type wells.

The structure 100 includes an interlayer dielectric (ILD) layer 110 (which is the first layer) formed on top of the substrate 105. In one implementation, the ILD layer 110 may be a low-k dielectric material or an ultra-low-k dielectric material. In an implementation, material of the ILD layer 110 may be tetraethyl orthosilicate (TEOS). In one implementation, the ILD layer 110 may include an oxide material. The thickness in the y-axis of the ILD layer 110 may range from 110 nm to 230 nm.

Gates 115 may be formed in the ILD layer 110. Gate contacts (CB) 125 are formed on top of the gates 115. In one implementation, the gates 115 may be high-k metal gates. The gates 115 may include a high-k material, such as, e.g., hafnium dioxide ($HfO_2$), zirconium dioxide ($ZrO_2$), and titanium dioxide ($TiO_2$), with a metal on top. The gates 115 are formed over the substrate 105 as understood by one skilled in the art. The gates 115 extend in and out of the page in the z-axis, while the fin (substrate 105) extends in the x-axis.

The gate contact CB 125 may be a metal. In one implementation, the gate contact 125 may be copper (Cu), aluminum (Al), tungsten (W), cobalt (Co), etc.

The ILD layer 110 includes source and drain contacts 120 on either side of the gate 115, where a source contact 120 is on one side and a drain contact 120 is on the other side of the gate 115. The source/drain contacts 120 are also referred to as CA or CA contacts. The source/drain contacts (CA) 120 may include a metal such as, for example, copper, aluminum, tungsten, etc. In one implementation, the source/drain contact 120 may be a silicide contact.

The sources and drain contacts 120 are respectively formed over doped areas in/on the substrate 105 to form wells (not shown). The doped areas in the substrate 105 may be p-type or n-type wells depending on the application. Depending on the application, one or more shallow trench isolations (STI) are formed in the substrate 105 to prevent electric current leakage between adjacent semiconductor device components. The top of the structure 100 is planarized, for example, via chemical mechanical polishing/planarization (CMP). The various features in FIG. 1 may be performed using standard lithography processes.

Figure 2:
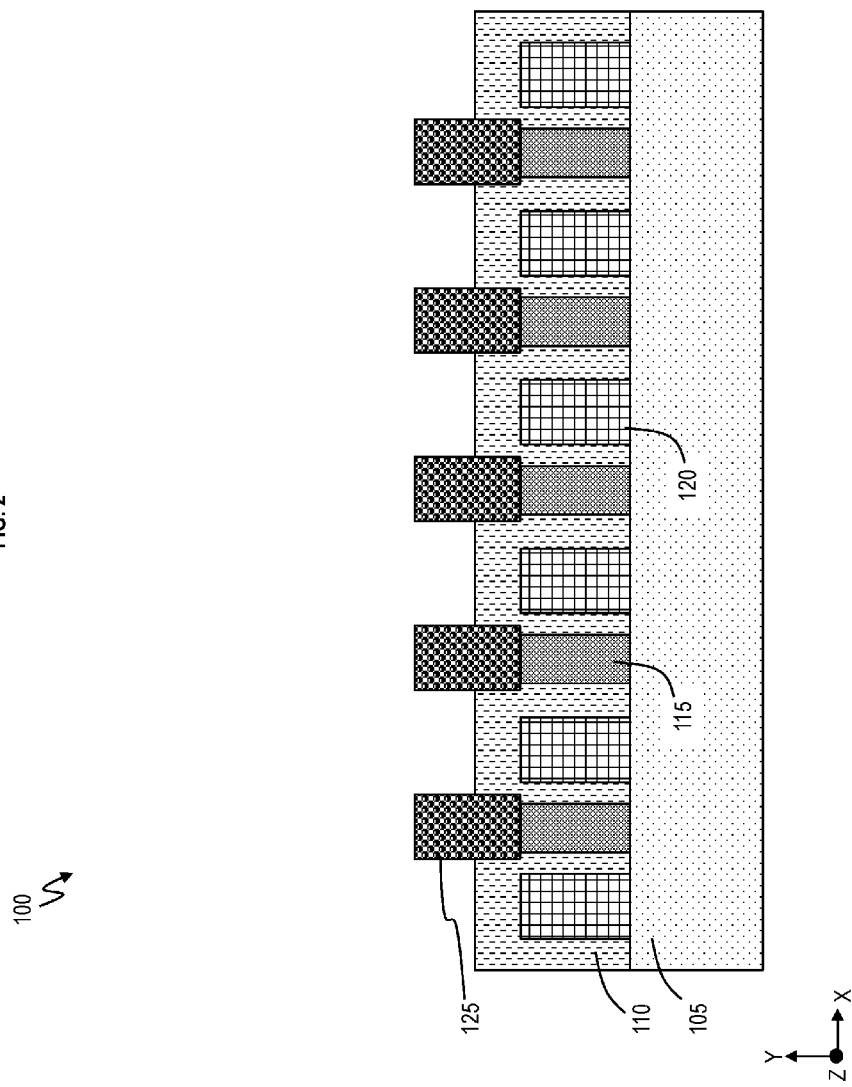
FIG. 2 is a cross-sectional view of the structure depicting recessing an interlayer dielectric layer to expose gate contacts according to one or more embodiments.

FIG. 2 is a cross-sectional view of the structure 100 depicting recessing the ILD layer 110 to expose the gate contacts (CB) 125 according to one or more embodiments. The ILD layer 110 may be recessed such that sides of the gate contacts 125 are exposed. The depth of etching for the ILD layer 110 should be at least enough to accommodate the thickness of the cap layer that is to be deposited subsequently. CMP or dry etching may be utilized to recess the ILD layer 110.

Figure 3:
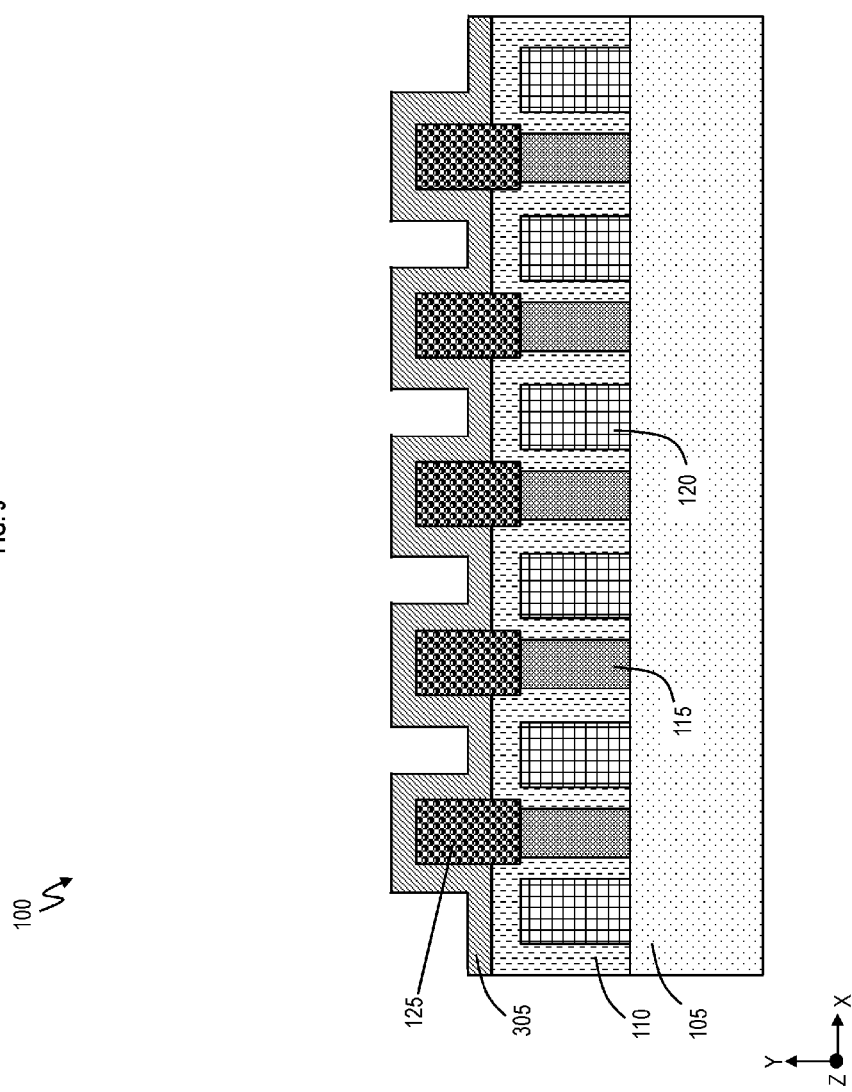
FIG. 3 is a cross-sectional view of the structure depicting cap layer deposition according to one or more embodiments.

FIG. 3 is a cross-sectional view of the structure 100 depicting cap layer deposition according to one or more embodiments. The cap layer 305 may be conformally deposited on top of the structure 100. The cap layer 305 is on top of the ILD layer 110, along with the sides and top of the gate contact 125.

The thickness of the deposited cap layer 305 may range from about 10-20 nm. Accordingly, the ILD layer 110 should have been recessed by more than 10-20 nm to accommodate the thickness of the cap layer 305.

Figure 4:
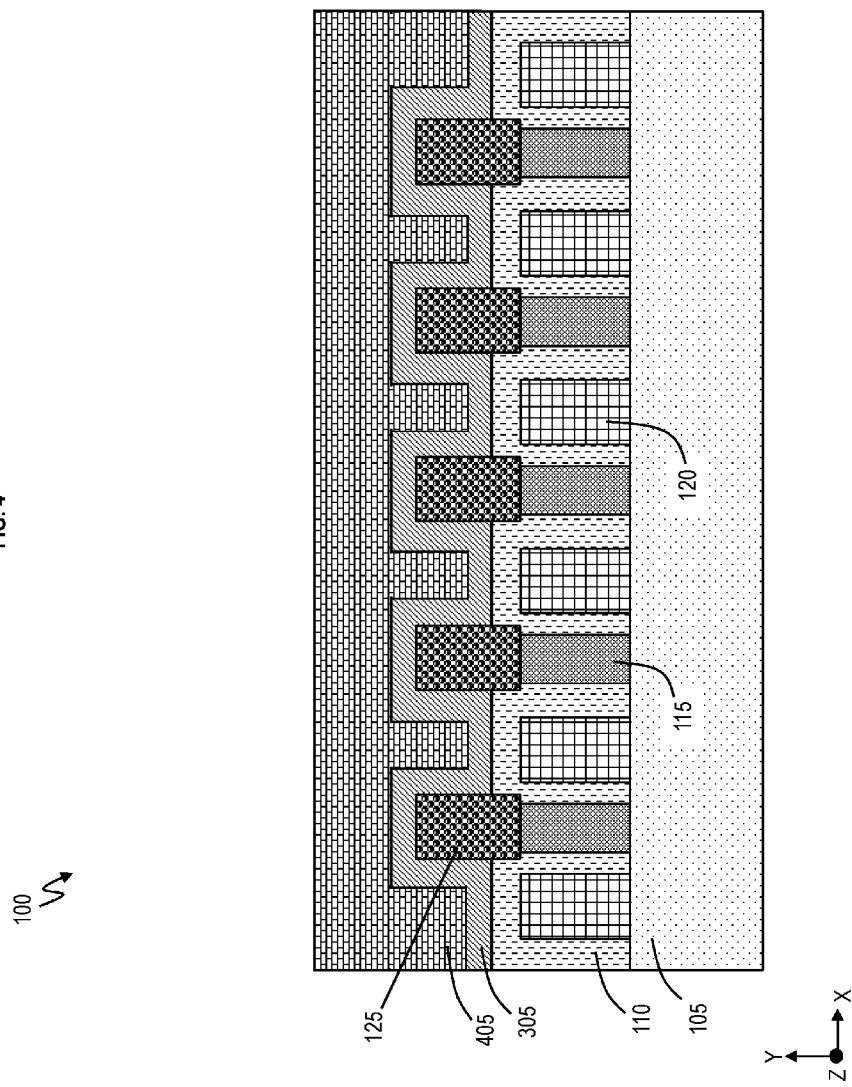
FIG. 4 is a cross-sectional view of the structure depicting deposition of a filling layer according to one or more embodiments.
Figure 5:
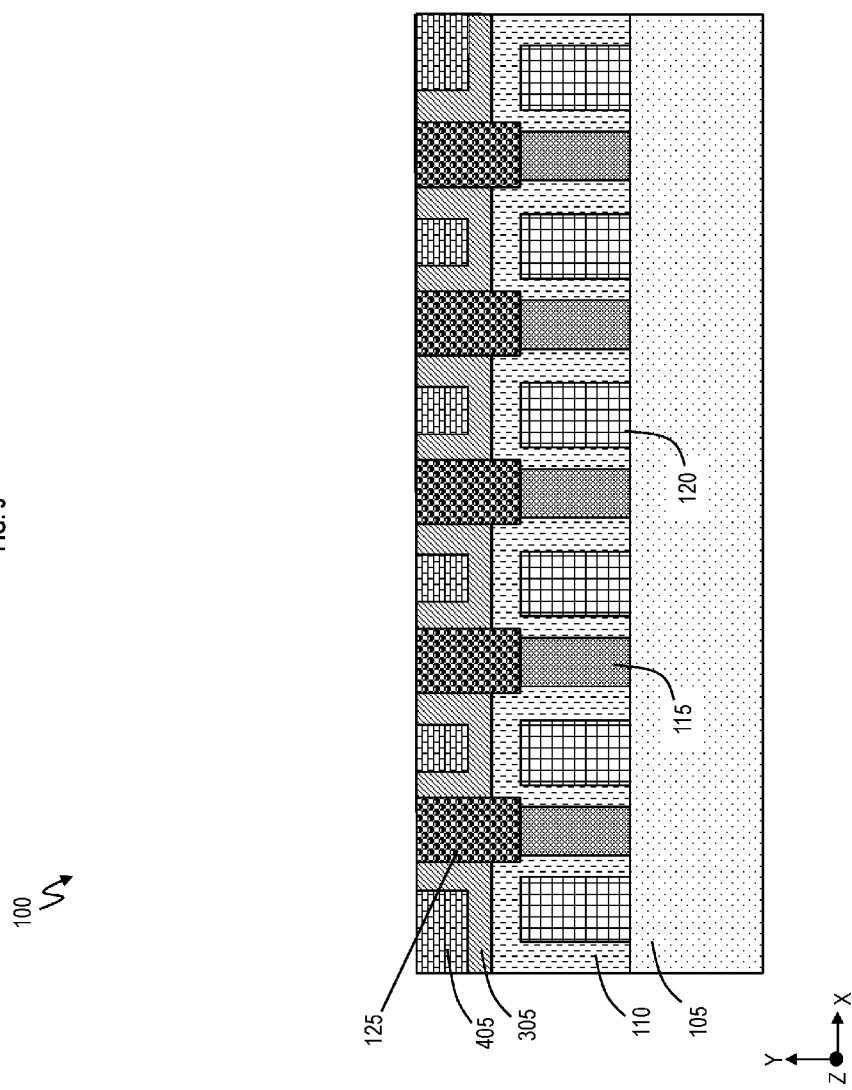
FIG. 5 is a cross-sectional view of the structure depicting recessing the filling layer and the cap layer according to one or more embodiments.

FIG. 4 is a cross-sectional view of the structure 100 depicting deposition of a filling layer 405 (which may be referred to as the second layer) according to one or more embodiments. The filling layer 405 is deposited on top of the cap layer 305 and planarized. The material for the cap layer 305 and the filling layer 405 are designed to have different selectivity with regards to etching. Examples materials of the cap layer 305 may include nitride or oxide material such as silicon nitride ($Si_xN_x$), silicon carbon nitride (SiCN), silicon oxynitride (SiON), aluminum nitride ($Al_xN_y$), or any other suitable material including an insulator material. An example material of the filling layer 405 may be silicon nitrogen oxygen (SiNO) which has a different etch rate than the cap layer 305, such that the cap layer 305 can be selectively etched while not etching (or etching at a slower rate) the filling layer 405. Other example materials of the filling layer 405 may include silicon oxide, fluorinated silicon oxide, and low-k dielectric materials such as, for example, hydrogenated silicon oxycarbide and porous hydrogenated silicon oxycarbide materials. FIG. 5 is a cross-sectional view of the structure 100 depicting recessing the filling layer 405 and the cap layer 305 according to one or more embodiments. The filling layer 405 and the cap layer 305 are recessed to be level with the top of the gate contacts 125, such that the top surface of the gate contacts 125 is exposed.

Figure 6:
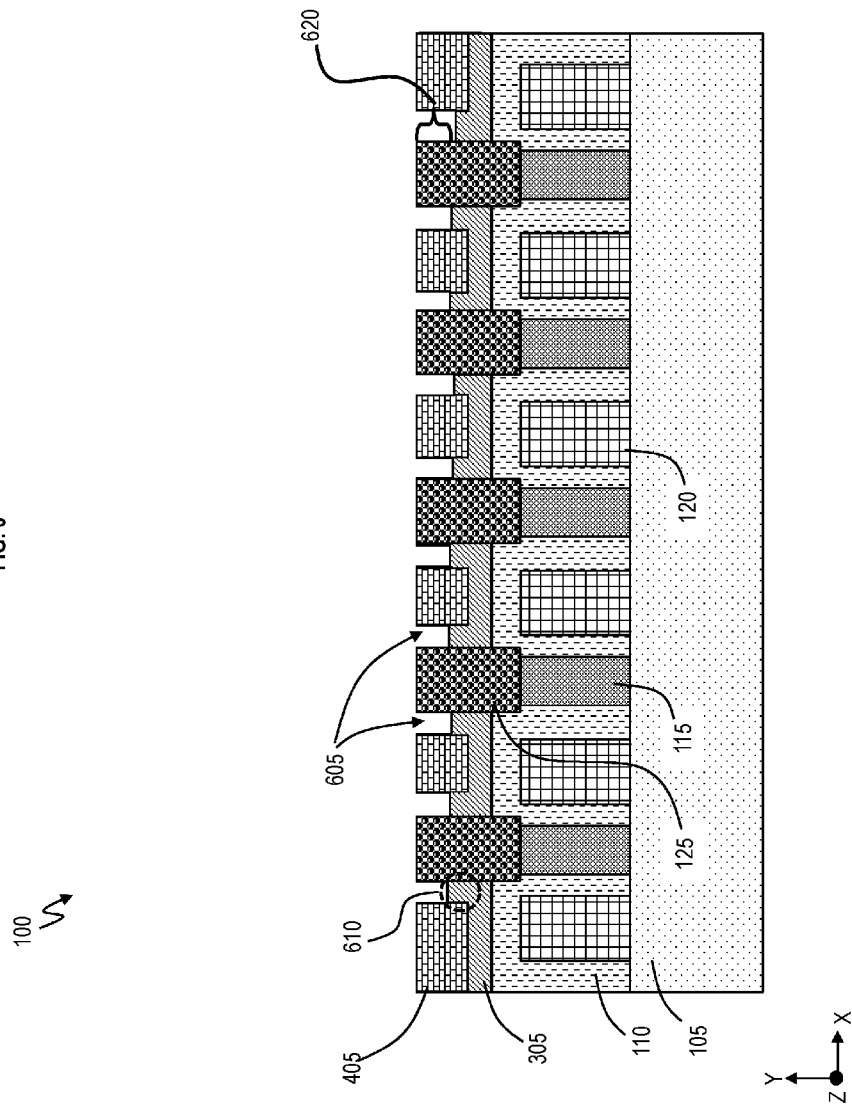
FIG. 6 is a cross-sectional view of the structure depicting partial cap layer recess according to one or more embodiments.

FIG. 6 is a cross-sectional view of the structure 100 depicting partial cap layer recess according to one or more embodiments. The partial cap layer recess removes a portion of the cap layer 305 that abuts the gate contact 125. Part of the cap layer 305 is on top of the ILD layer 110 and part of the cap layer 305 is on the sidewalls of the gate contact 125. The recess is an etch that reduces the height in the y-axis of the cap layer 305 that is formed on the sidewalls of the gate contact 125. The recess creates grooves 605 on both sides of the gate contacts 125 and results in short vertical cap layer sidewalls 610 of the cap layer material. In one implementation, the height of cap layer sidewalls 610 may range from 5 to 25 nm.

By recessing the cap layer 305 formed on the sides of the gate contact 605, upper sidewalls 620 of the gate are exposed, thereby creating the groove 605.

In an implementation for the cap layer 305 being SiN and/or $Al_xN_y$ and the filling layer 405 being SiNO, an example etchant to etch the cap layer 305 and not the filling layer 405 may be, but not limited to, trifluoromethane ($CHF_3$) and/or nitrogen trifluoride ($NF_3$) as the main active gas during the RIE plus diluent gas. Conversely, an example etchant to etch the filling layer 405 and not the cap layer 305 with some selectivity may be, but not limited to, carbon dioxide ($CO_2$) and/or difluoromethane ($CH_2F_2$) as the main active gas during the RIE plus diluent gas.

FIG. 7A is a cross-sectional view of the structure 100 depicting deposition of layers to be utilized in preparation for metal line formation according to one or more embodiments. A trench may be patterned and filled with metal so that a metal line can be formed as discussed further below.

A dielectric layer 705 (which may be referred to as the third layer) may be formed on top of the structure 100, and the dielectric layer 705 filled the previously formed grooves 605. The dielectric layer 705 may be an ultra-low-k dielectric material. A first trench hardmask layer 730 may be formed on top of the dielectric layer 705. Examples materials of the first trench hardmask layer 730 may include an oxide, silicon nitride (SiN), etc.

A second trench hardmask layer 735 may be deposited on top of the first trench hardmask layer 730. An example material of the second trench hardmask layer 735 may be titanium nitride (TiN). The first trench hardmask layer 730 and the second trench hardmask layer 735 are to be used to form a trench pattern that is horizontal to the page (i.e., in the x-axis).

FIG. 7B is a cross-sectional view of the structure 100 depicting deposition of layers in preparation for patterning a gate metal via trench according to one or more embodiments. The gate metal via trench is to be a hole formed over the gate contact 125.

An optical planarizing layer (OPL) 740 may be deposited on top of the second trench hardmask layer 735. A silicon-containing anti-reflective coating (SiARC) 745 may be formed on top of the optical planarizing layer 740. A photoresist layer 750 is formed on top of silicon-containing anti-reflective coating 745. The photoresist layer 750 is patterned to form via holes 755 in the photoresist layer 750 in preparation to form the gate metal via trench; particularly, the layers 740, 745, 750 are utilized to define the via lithography. The pattern of the via holes 755 is to be transferred below to form gate metal via trench below as depicted in FIG. 7C.

Figure 7C:
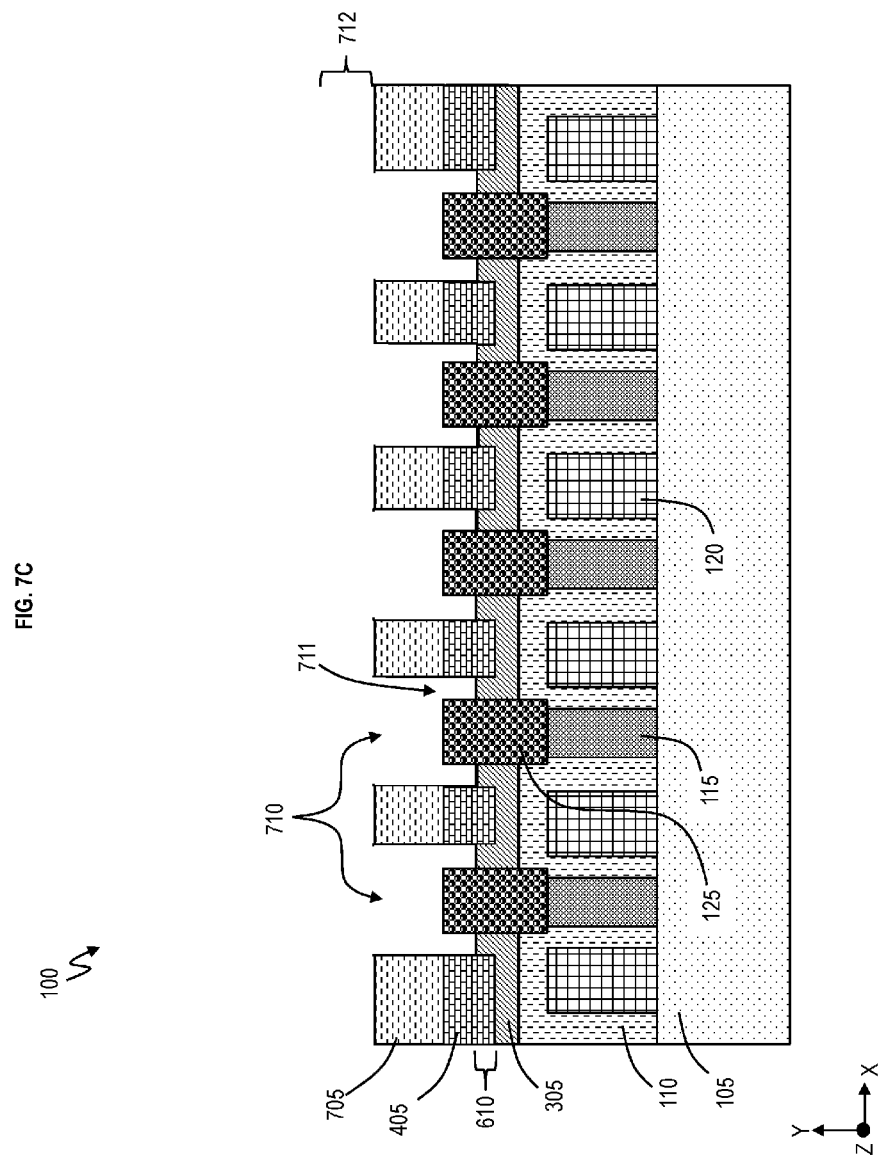
FIG. 7C is a cross-sectional view of the structure depicting gate metal via trench formation in preparation for the gate metal via according to one or more embodiments.

FIG. 7C is a cross-sectional view of the structure 100 depicting gate metal via trench formation in preparation for the gate metal via according to one or more embodiments.

A conventional etching (such as RIE) may be performed to etch the pattern, and a wet clean may be performed to remove all the top redundant layers 730, 735, 740, 740, 745, 750. After the etching and wet clean, a via and trench dual damascene pattern is formed. On the top of this cross-section, there is trench line (which is to later be filled with metal to form the metal line). It is noted that because the cross-sectional view cleaves (i.e., cuts) through the trench line, the reader cannot see the trench line. The trench line is depicted by a space pattern 712 from left to right on top of the dielectric layer 705.

In preparation for the gate metal via, trenches 710 are formed through the dielectric layer 705 to remove the dielectric layer 705 over the gate contact 125. The trench 710 is an open via down to and around the upper portion of the gate contact 125. The trenches 710 have been transferred according to the pattern of the via holes 755 with some CD shrink if needed (in FIG. 7B).

Embodiments are configured such that the etch to form the trenches 710 stops on the cap layer 305. Particularly, the cap layer 305 is a protective layer that stops the etching from reaching the source and drain contacts 120 below. The trench 710 is an over-etch because the trench 710 is formed to extend (i.e., to be opened) to the left and right of the gate contact 125 in the x-axis down to the top surface of the cap layer sidewalls 610, such that the gate metal via (V0) 805 wraps around the gate contact 125 in FIG. 8. The over-etch of the trench 710 is depicted as side grooves 711. The over-etch side groove 711 is a space on the sides of the gate contact 125. The height of the cap layer sidewalls 610 provides an extra layer of protection during the trench etching because the short vertical cap layer sidewall 610 is an extra thickness on top of the horizontally deposited layer of the cap layer 305.

In one implementation, the over-etch side grooves 711 of the trench 710 may correspond to the previous location of the groove 605. The over-etch side groove 711 is to be utilized for wrap-around contact with the gate contact 125 when the gate metal via (V0) 805 fills the trench 710.

Figure 8:
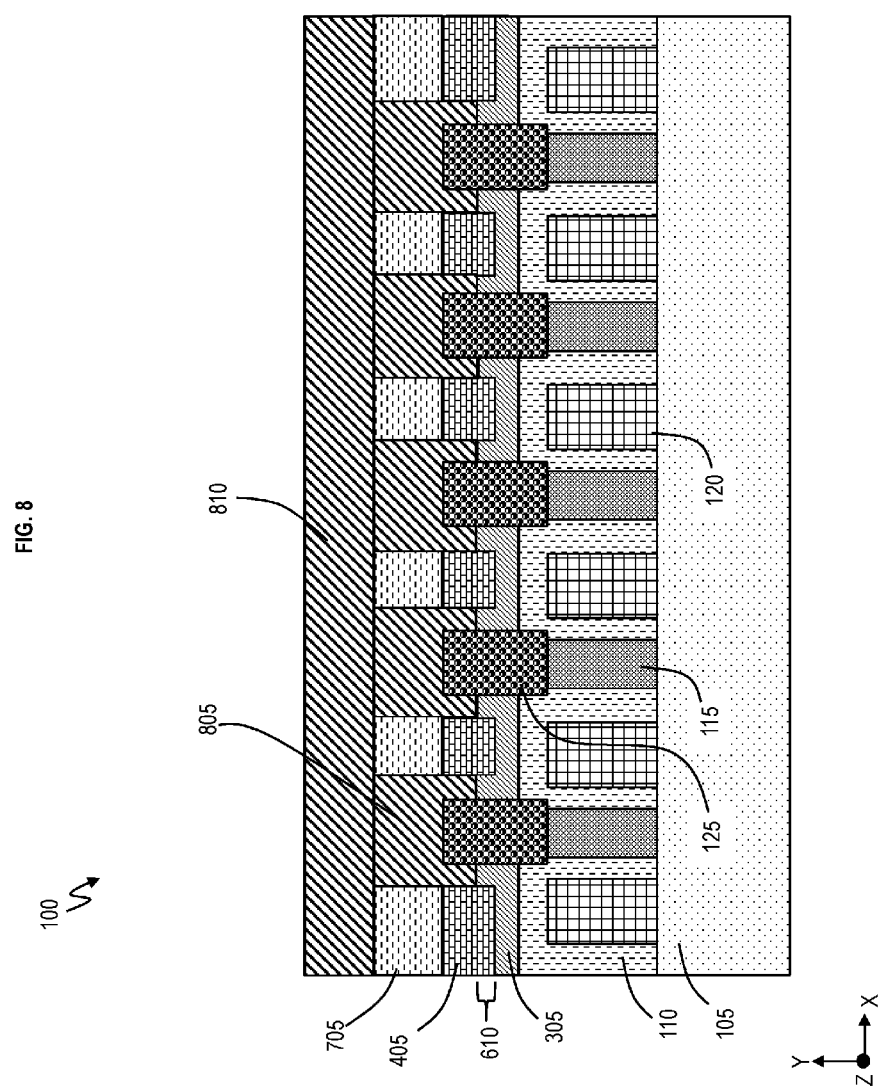
FIG. 8 is a cross-sectional view of the structure depicting metallization according to one or more embodiments.

FIG. 8 is a cross-sectional view of the structure 100 depicting metallization according to one or more embodiments. The gate metal via 805 is formed in the trenches 710 and the side grooves 711, such that material of the gate metal via 805 is on top of and wraps around the upper sidewalls 620 of the gate contact 125. The gate metal via 805 fills the trench 710 and side grooves 711, to thereby form an upside-down "U" shape on top of the gate contact 125. The gate metal via 805 stops on the cap layer sidewall 610 that abuts gate contact 125. The cap layer 305 has an additional level of protection by having the short vertical cap layer sidewall 610, such that the gate metal via 805 is further prevented from electrically connecting (i.e., electrically shorting) to the source and drain contacts 120.

A metal layer (M1) 810 is formed on top of the dielectric layer 705 and the gate metal vias (V0) 805. The metal layer 810 is the metal line that fills in the trench line 712. The metal layer 810 extends in the x-axis. The M1 and V0 process is understood by one skilled in the art. In one implementation, the metal of the metal layer (M1) 810 and the gate metal vias (V0) 805 may be copper, aluminum, tungsten, etc.

Figure 9:
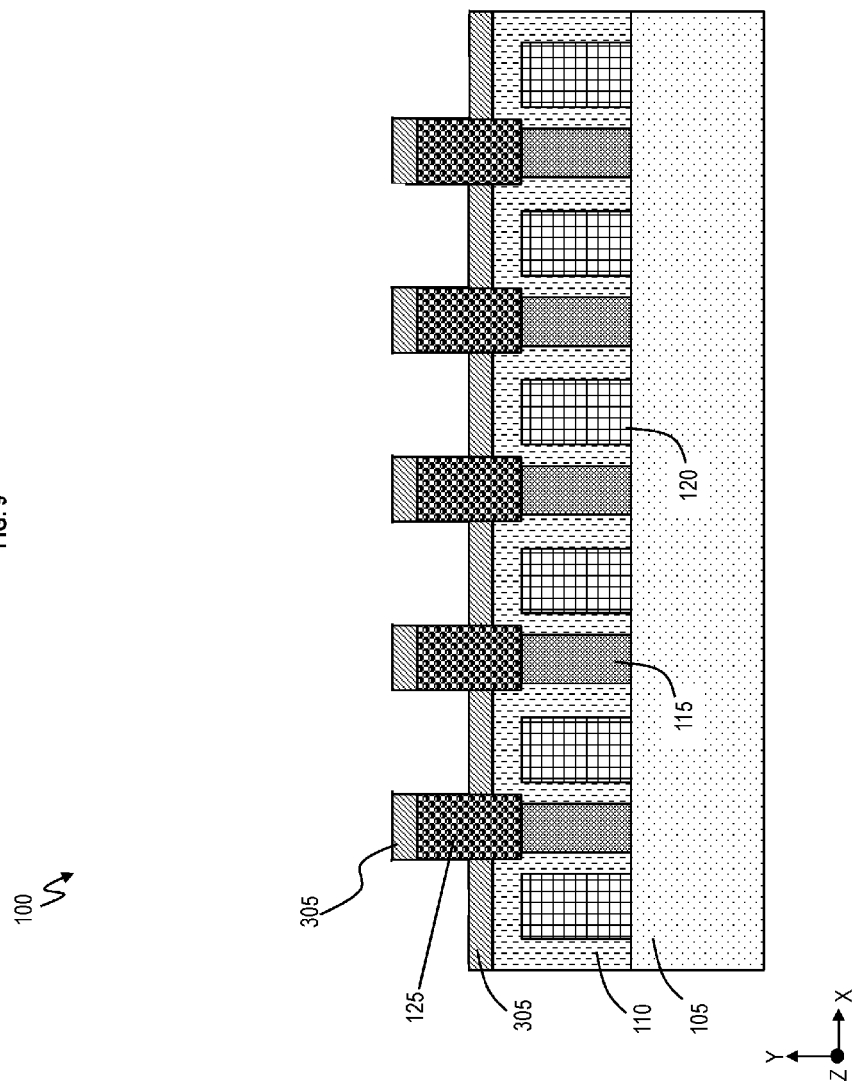
FIG. 9 is a cross-sectional view of the structure depicting a lateral cap layer recess, continuing from FIGS. 1-3, according to one or more embodiments.

The vertical cap layer sidewalls 610 of the cap layer 305 are optional and may not be present in other embodiments. FIGS. 9-13 disclose one or more embodiments in which the cap layer sidewalls 610 are not formed. The structure in FIGS. 9-13 includes the same features discussed herein but without the formation of the cap layer sidewalls 610. FIG. 9 continues from FIGS. 1-3.

Continuing from FIG. 3, FIG. 9 is a cross-sectional view of the structure 100 depicting a lateral cap layer recess according to one or more embodiments. In FIG. 9, an isotropic reactive ion etch (ME) may be performed to remove the cap layer 305 from the sides of the gate contact 125. However, the cap layer 305 remains on top of the ILD layer 110 and the top of the gate contact 125.

Figure 10:
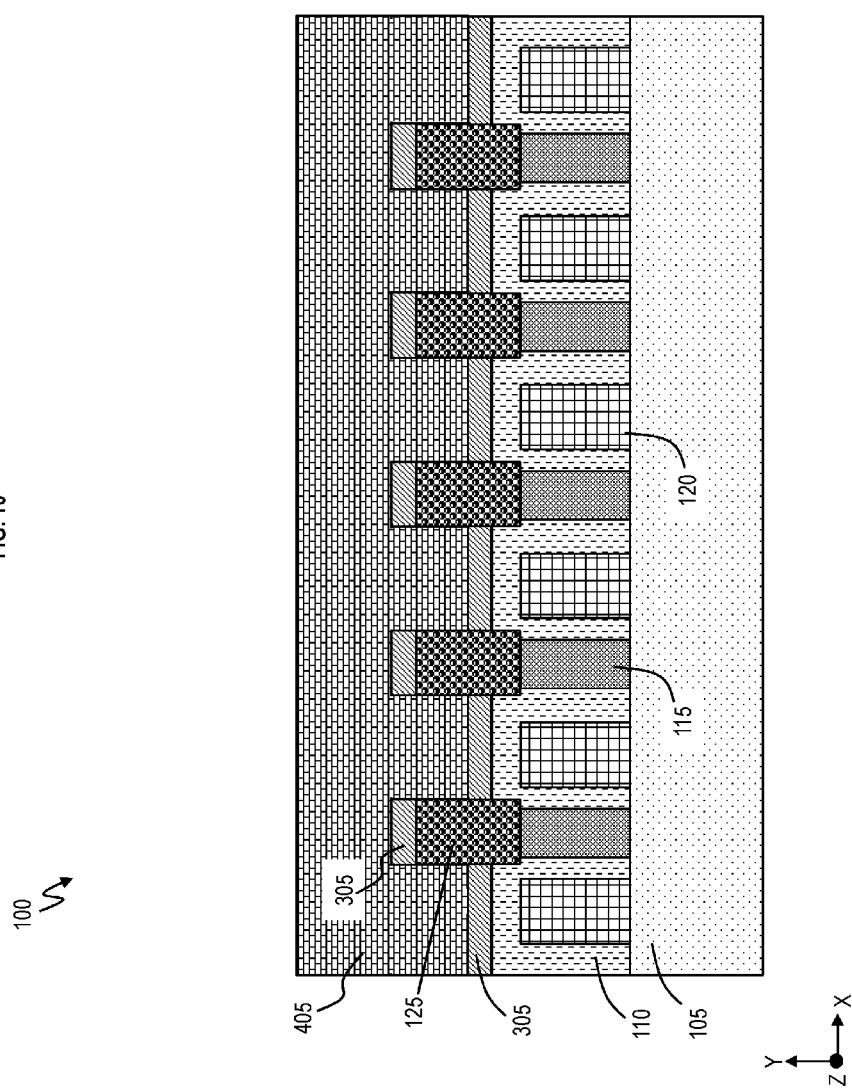
FIG. 10 is a cross-sectional view of the structure depicting deposition of the filling layer according to one or more embodiments.

FIG. 10 is a cross-sectional view of the structure 100 depicting deposition of the filling layer 405 according to one or more embodiments. The filling layer 405 is deposited on top of the cap layer 305 and on the sides of the gate contact 125. The filling layer 405 is planarized.

The material for the cap layer 305 and the filling layer 405 are designed to have different selectivity as discussed above in FIG. 4, and the details of the cap layer 305 and filling layer 405 are not repeated.

Figure 11:
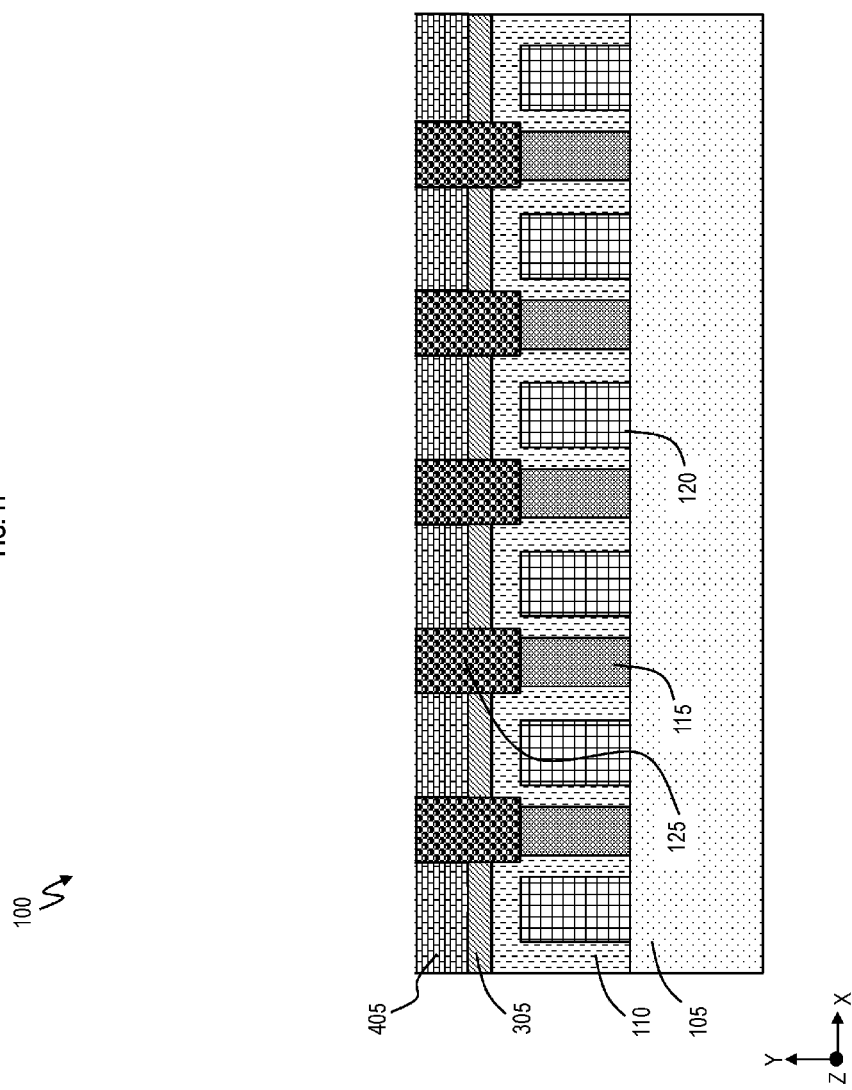
FIG. 11 is a cross-sectional view of the structure depicting recessing the filling layer according to one or more embodiments.

FIG. 11 is a cross-sectional view of the structure 100 depicting recessing the filling layer 405 and according to one or more embodiments. The filling layer 405 is recessed to be level with the top of the gate contacts 125, such that the top surface of the gate contacts 125 is exposed. Unlike FIG. 5, the cap layer 305 is not exposed during this recess in FIG. 11.

Figure 12A:
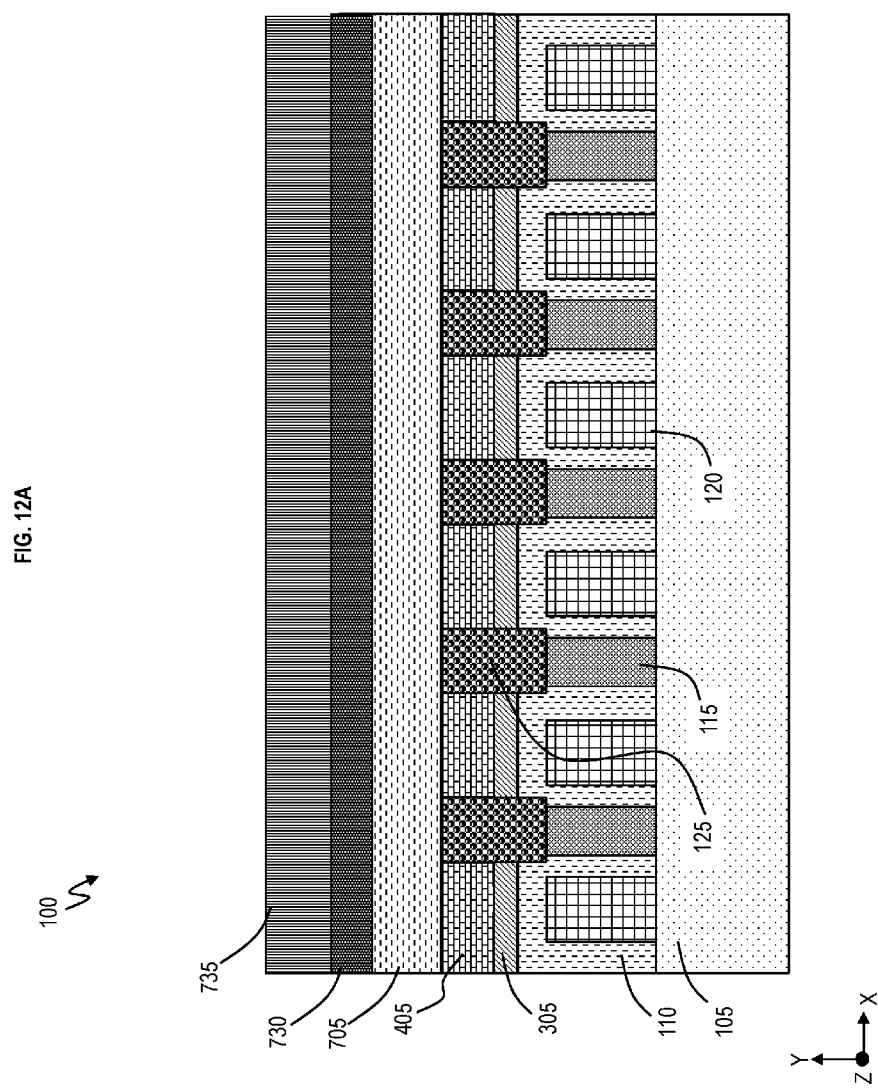
FIG. 12A is a cross-sectional view of the structure depicting deposition of layers to be utilized in preparation for metal line formation according to one or more embodiments.
Figure 12B:
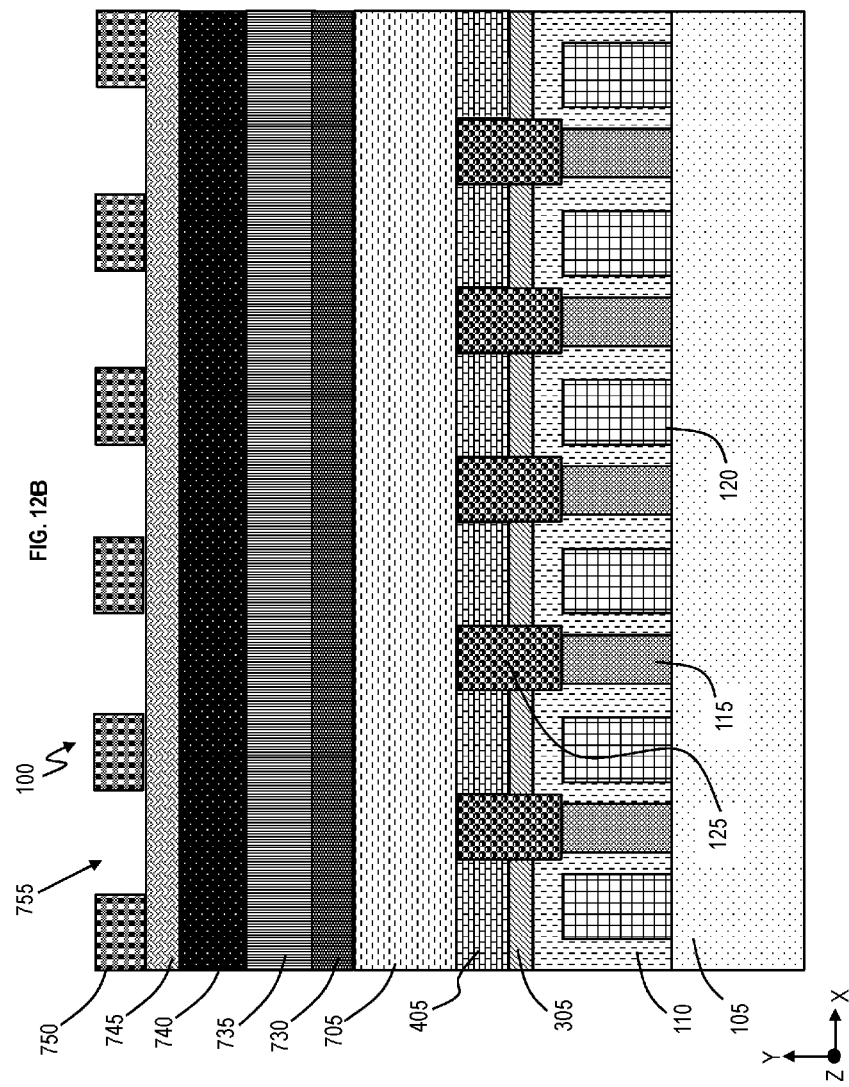
FIG. 12B is a cross-sectional view of the structure depicting deposition of layers in preparation for patterning a gate metal via trench according to one or more embodiments.
Figure 12C:
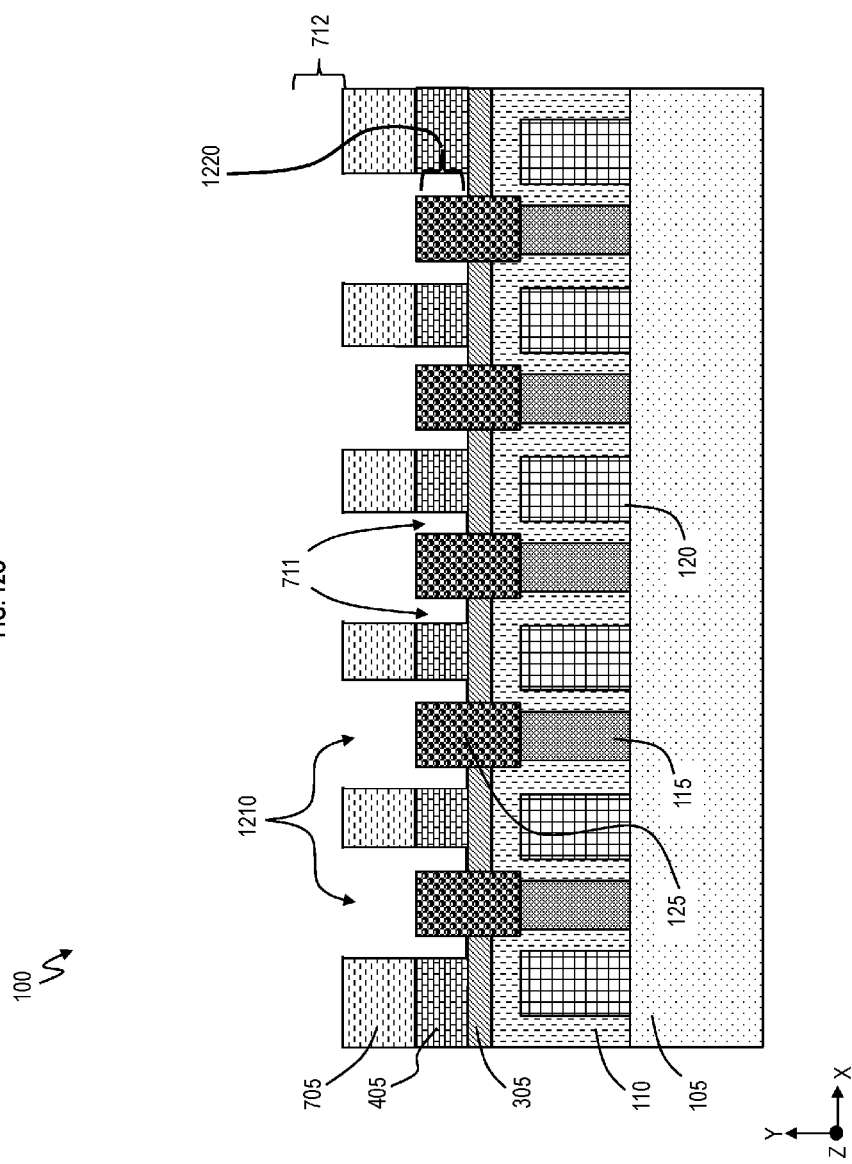
FIG. 12C is a cross-sectional view of the structure depicting gate metal via trench formation in preparation for the gate metal via according to one or more embodiments.

FIGS. 12A, 12B, and 12C are similar to FIGS. 7A, 7B, and 7C discussed above. Various techniques and materials utilized in FIGS. 7A, 7B, and 7C can apply to FIGS. 12A, 12B, and 12C. FIG. 12A is a cross-sectional view of the structure 100 depicting deposition of layers to be utilized in preparation for metal line formation according to one or more embodiments. A trench may be patterned and filled with metal so that a metal line can be formed as discussed further below.

The dielectric layer 705 (which may be referred to as the third layer) may be formed on top of the structure 100, and the dielectric layer 705 filled the previously formed grooves 605. The first trench hardmask layer 730 may be formed on top of the dielectric layer 705.

The second trench hardmask layer 735 may be deposited on top of the first trench hardmask layer 730. The first trench hardmask layer 730 and the second trench hardmask layer 735 are to be used to form a trench pattern that is horizontal to the page (i.e., in the x-axis).

FIG. 12B is a cross-sectional view of the structure 100 depicting deposition of layers in preparation for patterning the gate metal via trench according to one or more embodiments. The gate metal via trench is to be a hole formed over the gate contact 125. FIG. 12B is similar to and corresponds to the discussion for FIG. 7B.

The optical planarizing layer (OPL) 740 may be deposited on top of the second trench hardmask layer 735. The silicon-containing anti-reflective coating (SiARC) 745 may be formed on top of the optical planarizing layer 740. The photoresist layer 750 is formed on top of silicon-containing anti-reflective coating 745. The photoresist layer 750 is patterned to form via holes 755 in the photoresist layer 750 in preparation to form the gate metal via trench; particularly, the layers 740, 745, 750 are utilized to define the via lithography. The pattern of the via holes 755 is to be transferred below to form gate metal via trench below as depicted in FIG. 12C.

FIG. 12C is a cross-sectional view of the structure 100 depicting gate metal via trench formation in preparation for the gate metal via according to one or more embodiments. FIG. 12C is similar to and corresponds to the discussion for FIG. 12C.

A conventional etching (such as ME) may be performed to etch the pattern, and a wet clean may be performed to remove all the top redundant layers 730, 735, 740, 740, 745, 750. After the etching and wet clean, a via and trench dual damascene pattern is formed. On the top of this cross-section, there is trench line (which is to later be filled with metal to form the metal line). Again, it is noted that because the cross-sectional view cleaves (i.e., cuts) through the trench line, the reader cannot see the trench line. The trench line is depicted by a space pattern 712 from left to right on top of the dielectric layer 705.

In preparation for the gate metal via, trenches 1210 are formed through the dielectric layer 705 to remove the dielectric layer 705 over the gate contact 125. The trench 1210 is an open via down to and around the upper portion of the gate contact 125. The trenches 1210 have been transferred according to the pattern of the via holes 755 (in FIG. 12B).

Embodiments are configured such that the etch to form the trenches 1210 stops on the cap layer 305. As noted above, the cap layer 305 is a protective layer that stops the etching from reaching the source and drain contacts 120 below. The trench 1210 is an over-etch because the trench 710 is formed to extend (i.e., to be opened) to the left and right of the gate contact 125 in the x-axis down to the top surface of the cap layer 305, such that the gate metal via (V0) 805 wraps around the gate contact 125 in FIG. 13.

The over-etch of the trench 1210 is depicted as side grooves 711. The over-etch side groove 711 is formed along upper sidewall parts 1220 of the gate contact 125. The over-etch side groove 711 is a space on the sides of the gate contact 125. Unlike FIG. 7C, there are no cap layer sidewalls 610, and the over-etch side groove 711 stops on the cap layer 305. Even without the cap layer sidewalls 610, the cap layer 305 provides protection during the trench etching. The over-etch side groove 711 is to be utilized for wrap-around contact with the gate contact 125 when the gate metal via (V0) 805 fills the trench 710.

Figure 13:
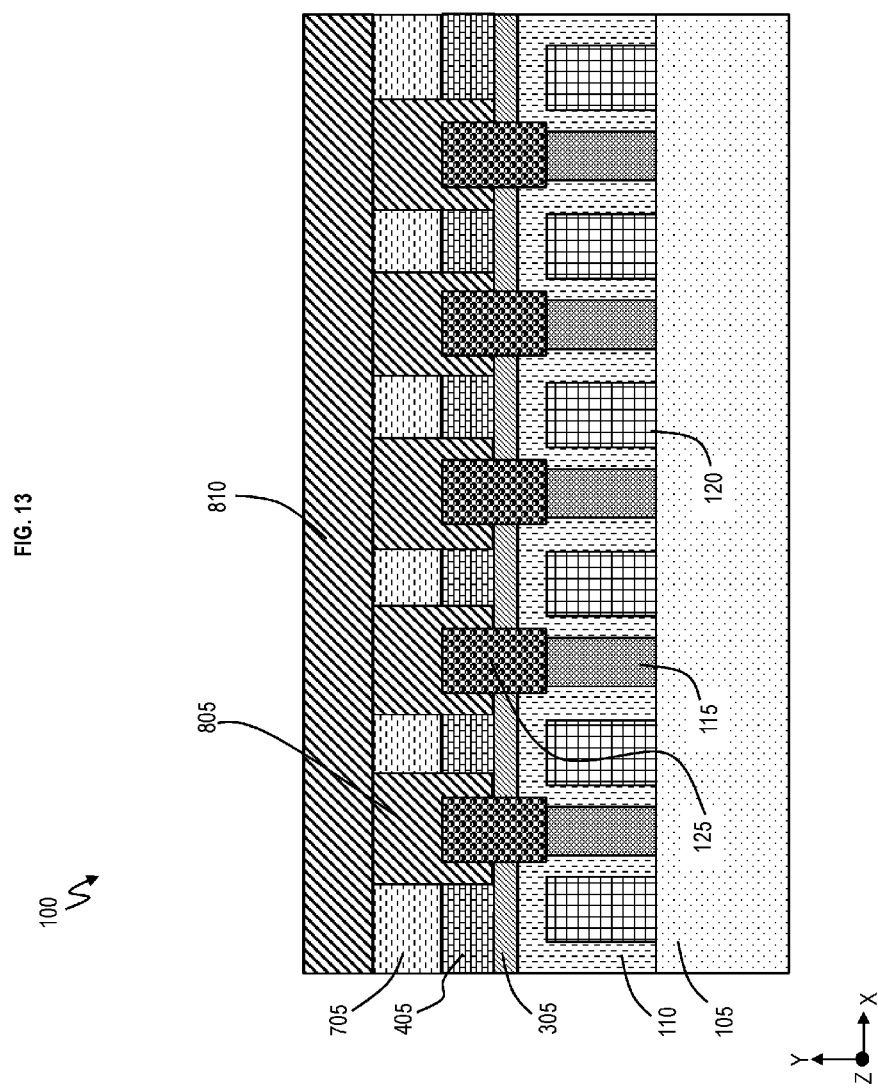
FIG. 13 is a cross-sectional view of the structure depicting metallization according to one or more embodiments.

FIG. 13 is a cross-sectional view of the structure 100 depicting metallization according to one or more embodiments. The gate metal via 805 is formed in the trenches 1210 and the side grooves 711, such that material of the gate metal via 805 is on top of and wraps around the upper sidewall parts 1220 of the gate contact 125. The gate metal via 805 fills the trench 1210 and side grooves 711 to thereby form an upside-down "U" shape on top of the gate contact 125 as discussed above. The gate metal via 805 stops on the cap layer 305 that abuts gate contact 125. As noted herein, the cap layer 305 provides protection and separation, such that the gate metal via 805 is prevented from electrically connecting (i.e., electrical short) to the sources and drains 120 below.

The metal layer (M1) 810 is formed on top of the dielectric layer 705 and the gate metal vias (V0) 805. As noted herein, the M1 and V0 process is understood by one skilled in the art. In one implementation, the metal of the metal layer (M1) 810 and the gate metal vias (V0) 805 may be copper, aluminum, tungsten, etc.

Figure 14:
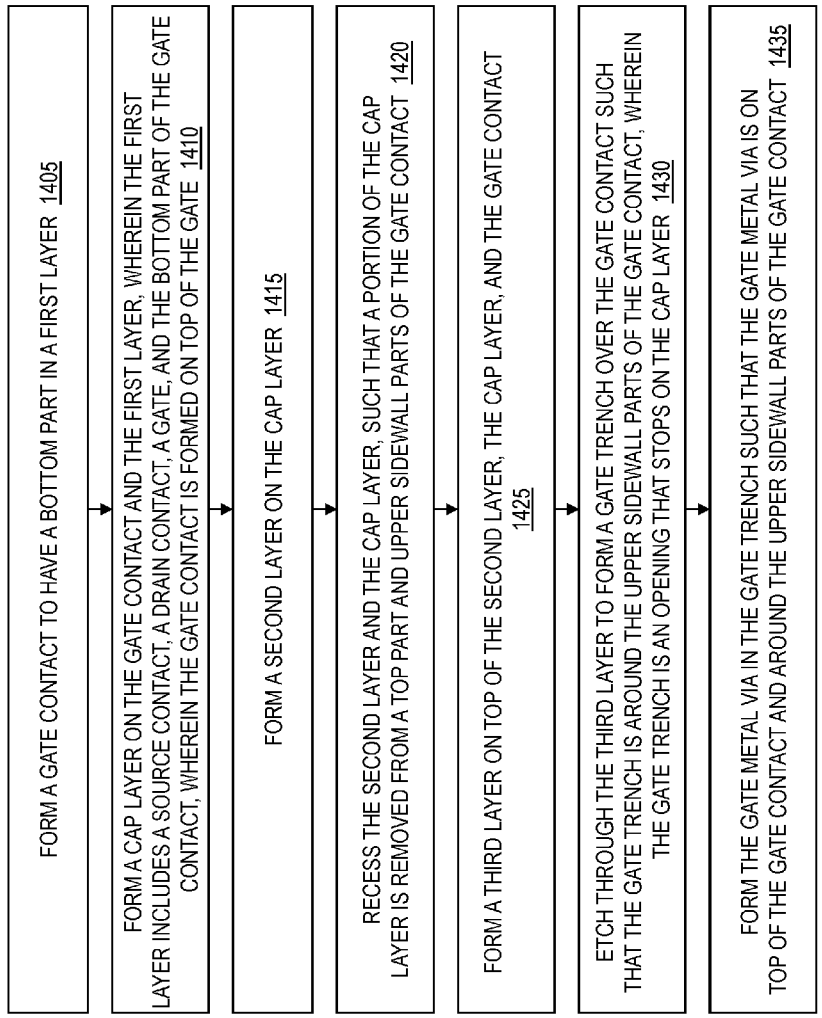
FIG. 14 is a flow chart of a method of forming gate metal vias for a semiconductor structure according to one or more embodiments.

FIG. 14 is a flow chart 1400 of a method of forming gate metal vias 805 of a semiconductor structure 100 according to one or more embodiments. Reference can be made to discussions for FIGS. 1-8.

At block 1405, a gate contact 125 is formed to have a bottom part in a first layer 110. An example is depicted in FIG. 2.

At block 1410, a cap layer 305 is formed on the gate contact 125 and the first layer 110, where the first layer 110 includes a source contact 120, a drain contact 120, a gate 115, and the bottom part of the gate contact 125, and where the gate contact 125 is formed on top of the gate 115. An example is depicted in FIG. 3.

At block 1415, a second layer 405 is formed on the cap layer 305. An example is depicted in FIG. 4.

At block 1420, the second layer 405 and the cap layer 305 are recessed, such that a portion of the cap layer 305 is removed from a top part and upper sidewall parts 620 of the gate contact 125. Examples are depicted in FIGS. 5 and 6.

At block 1425, a third layer 705 is disposed on top of the second layer 405, the cap layer 305, and the gate contact 125. At block 1430, etching is performed to etch through the third layer 705 to form a gate trench 710 over the gate contact 125 such that the gate trench 710 is around the upper sidewall parts 620 of the gate contact 125, where the gate trench 710 is an opening that stops on the cap layer 305. Examples are depicted in FIG. 7.

At block 1435, a gate metal via 805 is formed in the gate trench 710 such that the gate metal via 805 is on top of the gate contact 125 and wraps around the upper sidewall parts 620 of the gate contact 125. An example is depicted in FIG. 8.

The cap layer 305 and the second layer 405 are different materials. The cap layer 305 protects the source contact 120 and the drain contact 120 while etching through the third layer 705 to form the gate trench 710 over the gate contact 125 and around the upper sidewall parts 620 of the gate contact 125.

The gate metal via 805 is formed of a metal. The cap layer 305 prevents the metal of the gate metal via 805 from contacting either the source contact 120 or the drain contact 120.

The opening of the gate trench 710 does not reach the first layer 110 because of the cap layer 305. The portion of the cap layer 305 removed from the upper sidewall parts of the gate contact 125 leaves a vertical cap layer sidewall 610 abutting the gate contact 125. The opening of the gate trench 710 is down to the vertical cap layer sidewall 610 on both sides of the gate contact 125. A metal of the gate metal via 805 lands on top of the vertical cap layer sidewall 610 on both sides of the gate contact 125, thereby wrapping around the upper sidewall parts 620 of the gate contact 125. The source contact 120, the drain contact 120, and the gate 115 are formed on a substrate 105.

Figure 15A:
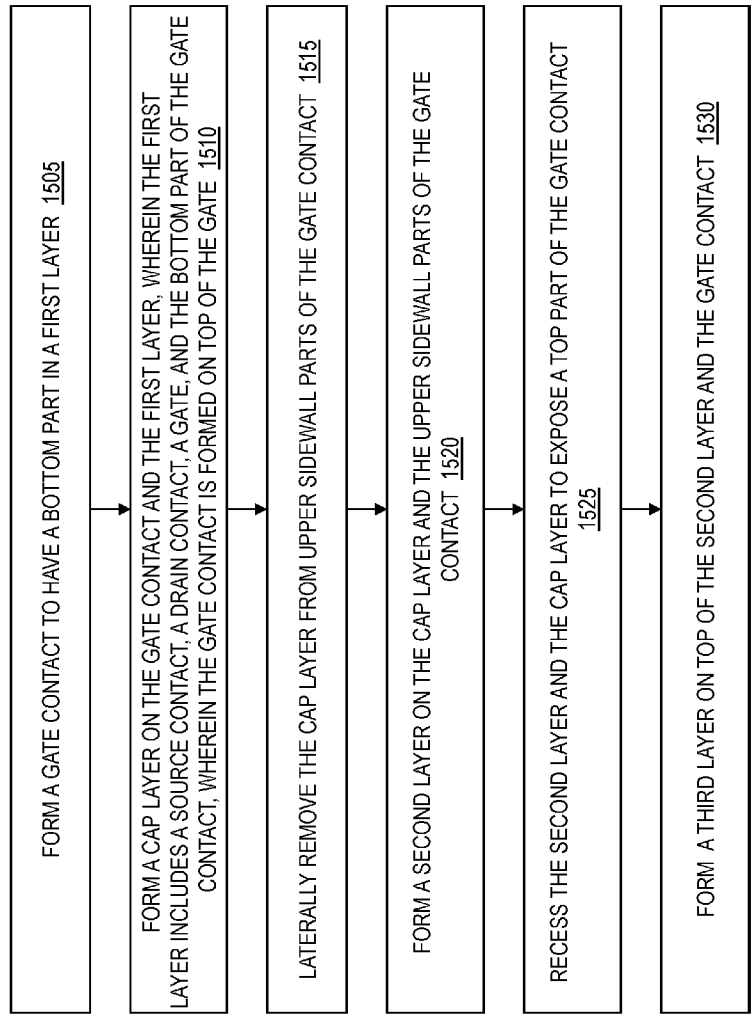
FIGS. 15A and 15B together are a flow chart of a method of forming gate metal vias for a semiconductor structure according to one or more embodiments.
Figure 15B:
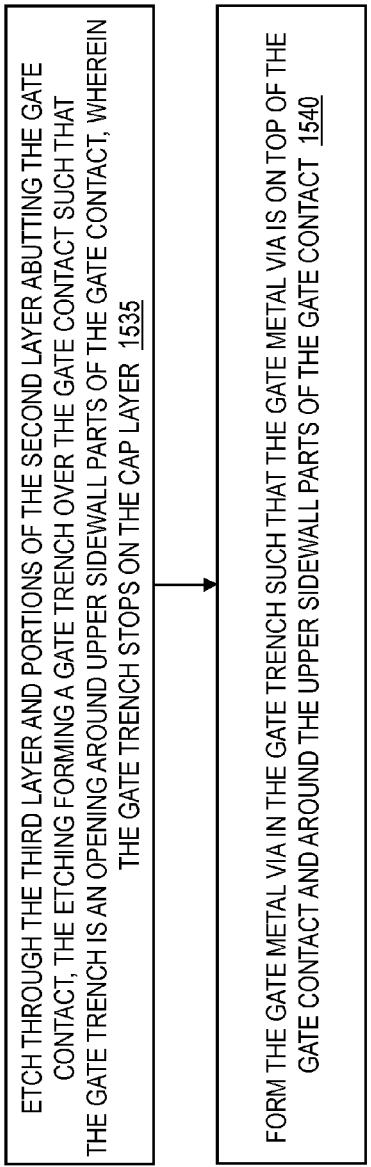

FIGS. 15A and 15B together are a flow chart 1500 a method of forming gate metal vias 805 for a semiconductor structure 100 according to one or more embodiments. Reference can be made to FIGS. 1-3 and 9-13.

At block 1505, a gate contact 125 is formed to have a bottom part in a first layer 110. An example is depicted in FIG. 2.

At block 1510, a cap layer 305 is formed on the gate contact 125 and the first layer 110, where the first layer 110 includes a source contact 120, a drain contact 120, a gate 115, and the bottom part of the gate contact 125, and where the gate contact 125 is formed on top of the gate 115. An example is depicted in FIG. 3.

At block 1515, the cap layer 305 is laterally removed from upper sidewall parts 1220 of the gate contact 125. An example is depicted in FIG. 9.

At block 1520, a second layer 405 is formed on the cap layer 305 and the upper sidewall parts 1220 of the gate contact 125. An example is depicted in FIG. 10.

At block 1525, the second layer 405 and the cap layer 305 are recessed to expose a top part of the gate contact 125. An example is depicted in FIG. 11.

At block 1530, a third layer 705 is formed on top of the second layer 405 and the gate contact 125. At block 1535, etching is performed to etch through the third layer 705 and portions of the second layer 405 abutting sides of the gate contact 125, where the etching forms a gate trench 1210 over the gate contact such that the gate trench 1210 is an opening around upper sidewall parts 1220 of the gate contact 125, and where the gate trench 1210 stops on the cap layer 305. Examples are depicted in FIGS. 12A, 12B, 12C.

At block 1540, a gate metal via 805 is formed in the gate trench 1210 such that the gate metal via 805 is on top of the gate contact 125 and wraps around the upper sidewall parts 1220 of the gate contact 125. An example is depicted in FIG. 13.

The cap layer 305 and the second layer 405 are different materials. The cap layer protects the source contact 120 and the drain contact 120 while etching through the third layer 705 to form the gate trench 1210 over the gate contact 125 and around the upper sidewall parts 1220 of the gate contact 125.

The gate metal via 805 is formed of a metal. The cap layer 305 prevents metal of the gate metal via 805 from contacting either the source contact 120 or the drain contact 120. The opening of the gate trench 1210 does not reach the first layer 110 because of the cap layer 305. The source contact 120, the drain contact 120, and the gate 115 are formed on a substrate 105.

A metal of the gate metal via 805 lands on top of the cap layer 305, in the opening created by etching through portions of the second layer 405 abutting the gate contact 125, on both sides of the gate contact 125, thereby wrapping around the upper sidewall parts 1220 of the gate contact 125.

Technical effects and benefits include improved semiconductor devices, such as, e.g., integrated circuits, on a wafer. The improved integrated circuit improves a computer processor. The technical effects further include novel methodologies and structures in which a cap layer is provided as an etch stop layer. The cap layer is configured to prevent a gate metal via V0 short to the source and/or drain contacts (CA).

It should be appreciated that the design for semiconductor devices may be included in or utilize features of an integrated circuit layout. An integrated circuit (IC) layout is also known as an IC layout, IC mask layout, or mask design. The integrated circuit layout is the representation of an integrated circuit in terms of planar geometric shapes which correspond to the patterns of metal, oxide, semiconductor layers, etc., that make up the components of the integrated circuit. Such an integrated circuit layout, including the layout of a semiconductor device, may be stored in a computer readable medium in preparation for fabrication as understood by one skilled in the art.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a gate metal via, the method comprising;
   forming a gate contact to have a bottom part in a first layer;
   forming a cap layer on the gate contact and the first layer, wherein the first layer includes a source contact, a drain contact, a gate, and the bottom part of the gate contact, wherein the gate contact is formed on top of the gate;
   forming a second layer on the cap layer;
   recessing the second layer and the cap layer, such that a portion of the cap layer is removed from a top part and upper sidewall parts of the gate contact;
   forming a third layer on top of the second layer, the cap layer, and the gate contact;
   etching through the third layer to form a gate trench over the gate contact such that the gate trench is around the upper sidewall parts of the gate contact, wherein the gate trench is an opening that stops on the cap layer; and
   forming the gate metal via in the gate trench such that the gate metal via is on top of the gate contact and around the upper sidewall parts of the gate contact.

2. The method of claim 1, wherein the cap layer and the second layer are different materials.

3. The method of claim 1, wherein the cap layer protects the source contact and the drain contact while etching through the third layer to form the gate trench over the gate contact and around the upper sidewall parts of the gate contact.

4. The method of claim 3, wherein the gate metal via is formed of a metal;
   wherein the cap layer prevents the metal of the gate metal via from contacting either the source contact or the drain contact.

5. The method of claim 1, wherein the opening of the gate trench does not reach the first layer because of the cap layer.

6. The method of claim 1, wherein the portion of the cap layer removed from the upper sidewall parts of the gate contact creates a vertical cap layer sidewall abutting the gate contact.

7. The method of claim 6, wherein the opening of the gate trench is down to the vertical cap layer sidewall on both sides of the gate contact.

8. The method of claim 7, wherein a metal of the gate metal via lands on top of the vertical cap layer sidewall on both sides of the gate contact, thereby wrapping around the upper sidewall parts of the gate contact.

9. The method of claim 1, wherein the source contact, the drain contact, and the gate are formed on a substrate.

10. A method of forming a gate metal via, the method comprising;
    forming a gate contact to have a bottom part in a first layer;
    forming a cap layer on the gate contact and the first layer, wherein the first layer includes a source contact, a drain contact, a gate, and the bottom part of the gate contact, wherein the gate contact is formed on top of the gate;
    laterally removing the cap layer from upper sidewall parts of the gate contact;
    forming a second layer on the cap layer and the upper sidewall parts of the gate contact;
    recessing the second layer and the cap layer to expose a top part of the gate contact;
    forming a third layer on top of the second layer and the gate contact;
    etching through the third layer and portions of the second layer abutting the gate contact, the etching forming a gate trench over the gate contact such that the gate trench is an opening around the upper sidewall parts of the gate contact, wherein the gate trench stops on the cap layer; and
    forming the gate metal via in the gate trench such that the gate metal via is on top of the gate contact and around the upper sidewall parts of the gate contact.

11. The method of claim 10, wherein the cap layer and the second layer are different materials.

12. The method of claim 10, wherein the cap layer protects the source contact and the drain contact while etching through the third layer to form the gate trench over the gate contact and around the upper sidewall parts of the gate contact.

13. The method of claim 12, wherein the gate metal via is formed of a metal;
    wherein the cap layer prevents the metal of the gate metal via from contacting either the source contact or the drain contact in the first layer.

14. The method of claim 10, wherein the opening of the gate trench does not reach the first layer because of the cap layer.

15. The method of claim 10, wherein the source contact, the drain contact, and the gate are formed on a substrate.

16. The method of claim 10, wherein a metal of the gate metal via lands on top of the cap layer, in the opening created by etching through the portions of the second layer abutting the gate contact, on both sides of the gate contact, thereby wrapping around the upper sidewall parts of the gate contact.

* * * * *